US006988192B2

(12) United States Patent
Snider

(10) Patent No.: US 6,988,192 B2
(45) Date of Patent: Jan. 17, 2006

(54) METHOD AND APPARATUS FOR COMPILING SOURCE CODE TO CONFIGURE HARDWARE

(75) Inventor: Gregory S. Snider, Mountain View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 642 days.

(21) Appl. No.: 10/068,886

(22) Filed: Feb. 11, 2002

(65) Prior Publication Data

US 2003/0154466 A1 Aug. 14, 2003

(51) Int. Cl.
G06F 9/24 (2006.01)
G06F 9/45 (2006.01)
(52) U.S. Cl. .............................. 713/1; 717/140; 703/13
(58) Field of Classification Search ...................... None
See application file for complete search history.

(56) References Cited

U.S. PATENT DOCUMENTS

| 5,933,642 A | * | 8/1999 | Greenbaum et al. | ......... 717/140 |
| 6,308,323 B1 | * | 10/2001 | Douniwa | ..................... 717/154 |
| 6,345,384 B1 | * | 2/2002 | Sato | ........................... 717/160 |
| 6,662,302 B1 | * | 12/2003 | Garey | ........................ 713/324 |
| 2002/0100029 A1 | * | 7/2002 | Bowen | ........................ 717/140 |

* cited by examiner

*Primary Examiner*—Chun Cao

(57) ABSTRACT

An embodiment of the invention includes, parsing a source code, performing a plurality of optimizations on the parsed code, generating a plurality of configuration instruction sets based on the optimized source code and automatically selecting one of the plurality of generated configuration instruction sets according to a user defined criteria, the selected configuration instruction set being used to configure hardware.

26 Claims, 6 Drawing Sheets

METHOD AND APPARATUS FOR COMPILING SOURCE CODE TO CONFIGURE HARDWARE

FIELD OF THE INVENTION

The invention relates generally to compiling source code and more particularly to a compiling source code to configure hardware.

BACKGROUND OF THE INVENTION

The advancement of the integrated circuit, printed circuit board and other related technologies is advancing at a very rapid rate. The latest generation of integrated circuits can incorporate over more four times the amount of circuitry that was possible just a few years ago. Furthermore, circuit board and multi-chip module technology have allowed much denser circuit board designs. These and other developments have increased the development of increasingly complex and high-speed computer systems.

The design of such high-speed computer systems has become increasingly difficult and time consuming. In order to maximize performance and to minimize the size and power of such computer systems, designers often implement much of the hardware in a number of integrated circuits. The integrated circuits are often custom or semi-custom designed. Each of these custom integrated circuits may contain several hundred thousand gates, and each gate must be placed and routed in accordance with the overall computer system specification.

To design such a computer system, the designer typically produces an overall system specification using a hardware description language. VHDL and Verilog are the most common conventional hardware description languages. VHDL describes the behavior and structure of electrical systems, but is particularly suited as a language to describe the behavior and structure of digital electronic hardware designs, such as application specific intergrated circuits (ASICs) and field programmable gate arrays (FPGAs) as well as conventional digital circuits. Verilog is a textual format for describing electronic circuits and systems. Applied to electronic design, Verilog is intended to be used for system verification through simulation, for timing analysis, for test analysis (testability analysis and fault grading) and for logic synthesis.

As electronic hardware design becomes increasingly miniaturized, the tools of the designer must allow for more flexibility. The problem with conventional design languages like VHDL and Verilog is efficiently implementing hardware structures for computation. The conventional hardware design languages do not automate the micro-architectural designs needed.

The described approaches are not able to synthesize many different hardware implementations depending on the global context of the computation without having to change or annotate the original source.

SUMMARY OF THE INVENTION

In one embodiment, the invention is a method of implementing operations representing computations in a compiler, the method comprising the steps of parsing a source code, performing a plurality of optimizations on the parsed code, generating a plurality of configuration instruction sets based on the optimized source code, and automatically selecting one of the plurality of generated configuration instruction sets according to a user defined criteria, the selected configuration instruction set being used to configure hardware.

In another respect, the invention is a method for compiling source code comprising steps of generating an internal representation of the source code, analyzing data flow properties of the internal representation in order to optimize the internal representation, automatically generating a plurality of configuration instruction sets based on the optimized internal representation, generating a plurality of configuration instruction sets based on the optimized source code, and automatically selecting one of the plurality of generated configuration instruction sets according to a user defined criteria, the selected configuration instruction set being used to configure hardware.

In another respect, the invention is a system for using software to generate a circuit comprising a processor operable to receive source code, a complier automatically generating a plurality of configuration sets from the received source code and selecting one of the plurality of configuration sets based on user defined criteria, and a configurable hardware device receiving the selected configuration instruction set and being configured based on the received configuration instruction set.

In comparison to known prior art, certain embodiments of the invention are capable of achieving certain aspects, including some or all of the following: (1) allows the user to design hardware using arithmetic/logical operations without worrying about the implementation (2) hides implementation issues in hardware synthesis from the application; and (3) creates a layer of abstraction between the hardware and application levels. Those skilled in the art will appreciate these and other advantages and benefits of various embodiments of the invention upon reading the following detailed description of a preferred embodiment with reference to the below-listed drawings.

BRIEF DESCRIPTION OF THE DRAWINGS

The invention is described in greater detail hereinafter, by way of example only, through description of a preferred embodiment thereof and with reference to the accompanying drawings in which.

DETAILED DESCRIPTION OF A PREFERRED EMBODIMENT

Figure 1:
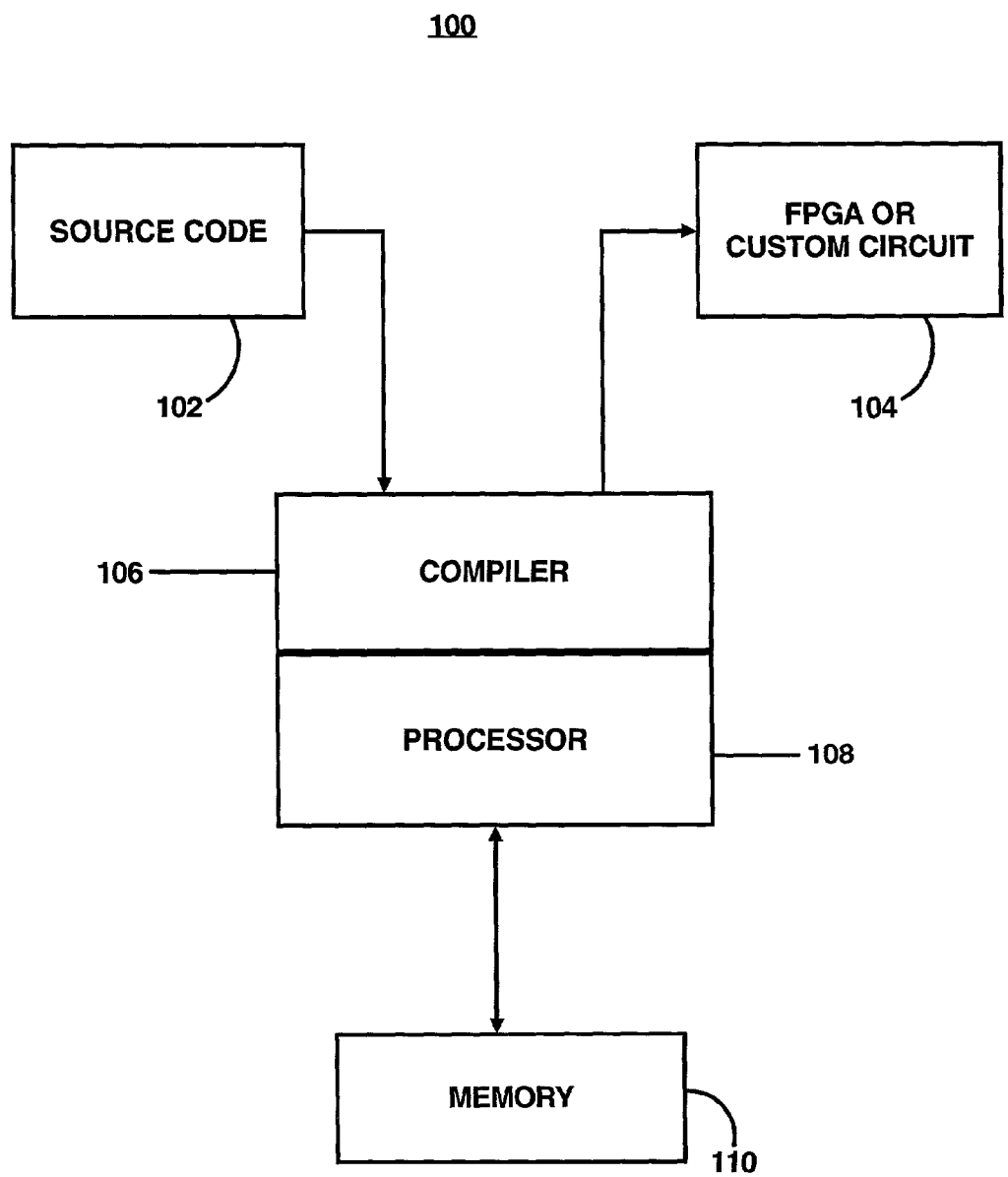
FIG. 1 is a block diagram illustration of a system of the invention, according to an embodiment of the invention.

In the following detailed description, numerous specific details are set forth in order to provide a thorough understanding of the present invention. However, it will be apparent to one of ordinary skill in the art that these specific details need not be used to practice the present invention. In other instances, well known structures, interfaces, and processes have not been shown in detail in order not to unnecessarily obscure the present invention.

An implementation of an algorithm is, generally, conceived to be a self-consistent sequence of steps leading to a desired result. These steps are those requiring physical manipulations of physical quantities. Usually, though not necessarily, these quantities take the form of electrical or magnetic signals capable of being stored, transferred, combined, compared, and otherwise manipulated. It proves convenient at times, principally for reasons of common usage, to refer to these signals as bits, values, elements, symbols, characters, terms, numbers or the like. It should be kept in mind, however, that all of these and similar terms are to be associated with the appropriate physical quantities and are merely convenient labels applied to these quantities.

In another embodiment, the present invention also relates to the apparatus for performing these operations. This apparatus may be specially constructed for the required purposes or it may comprise a general purpose computer as selectively activated or reconfigured by a computer program stored in the computer. The algorithms presented herein are not inherently related to a particular computer system or other apparatus. In particular, various general purpose computer systems may be used with computer programs written in accordance with the teachings of the present invention, or it may prove more convenient to construct more specialized apparatus, to perform the required method steps. The required structure for such machines will be apparent from the description given below.

In sum, the present invention preferably is implemented for practice by a computer. For example, a source code expression of the present invention is input to the computer to control operations therein. It is contemplated that a number of source code expressions, in one of many computer languages, could be utilized to implement the present invention. A variety of computer systems can be used to practice the present invention, including, for example, a personal computer, an engineering workstation, an enterprise server, etc. The present invention, however, is not limited to practice on any one particular computer system, and the selection of a particular computer system can be made for many reasons.

In one embodiment, the invention relates to a complier which performs mid-level (target dependent) optimizations in order to make speed/area tradeoffs on an implemented circuit. The choices are target-dependent, but can be directed by a set of parameters determined by the target architecture.

FIG. 1 is a block diagram illustration of a system 100, according to an embodiment of the invention. The system 100 includes an source code 102, field-programmable gate array (FPGA) or custom circuit design (such as an EDIF netlist) 104, a hardware complier 106, a processor 108 and a memory device 110.

The source code 102 typically includes of programming statements that are created by a programmer in order to take the design illustrated in the programming statements and map it into a predetermined architecture. The elements of the design are set forth in the mechanics of the programming language. The programming statements (not shown) are generally created with a text editor or visual programming tool and saved in a hardware description file (not shown). Typically, the source code 102 is a programmed in a high level language, such as C or Java. In the preferred embodiment of the invention, the source code 102 can be any known programming language. The source code 102 typically represents a plurality of computations or functions units. These computations can be routines, sub-routines or other computational statements that can be represented by the programming language.

The source code 102 is input into the hardware complier 106. The hardware complier 106 runs on the processor 108 and compiles the source code 102 into configuration instruction sets which indicates the layout of the predetermined architecture. The configuration instruction set may then be stored in the memory device 110. Also, the user may input criteria into the hardware complier 106. The criteria may be the desired speed and area constraints, as well as the relative importance of each. Also, the desired circuit power and maximum time needed to complete a computation are other criteria that may be entered. The hardware compiler 106 will be discussed with greater detail with regards to FIGS. 2–3.

If the target of the compilation is an FPGA, then generated configuration bits are communicated to the field-processor gate array (FPGA) 104. The FPGA 104 is an integrated circuit device that can be programmed in the field after manufacture. A configuration instruction set (which is a netlist for a custom circuit or configuration instructions for an FPGA) is output from the hardware complier 106 for reconfiguring FPGA 104 in order to generate the desired circuit. These devices are well known in the art. If the target of the compilation is a custom circuit, the generated netlist representing the circuit can then be further processed to create a custom integrated circuit.

Figure 2:
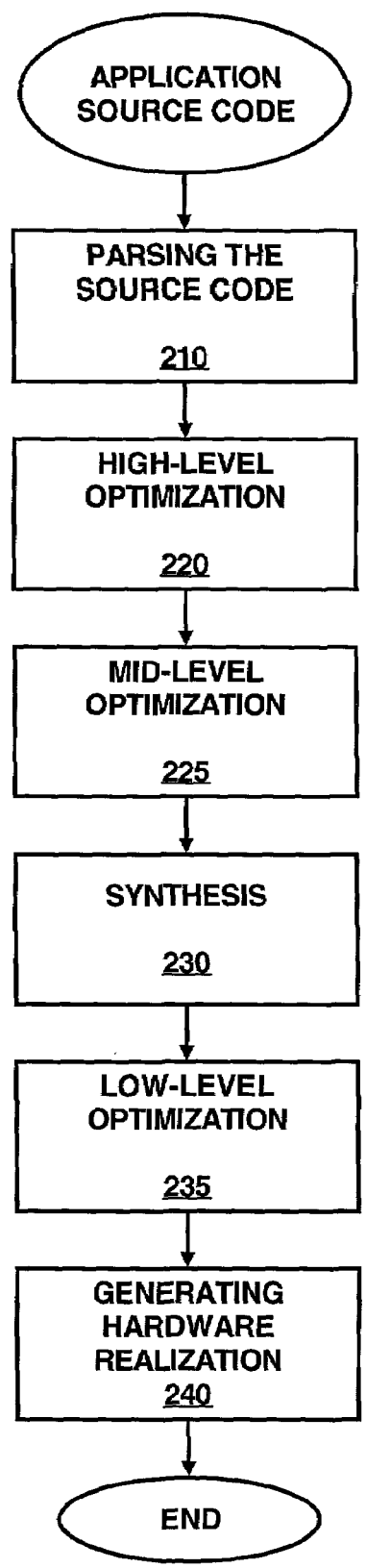
FIG. 2 is a flow-chart illustrating a method performed by a hardware complier, according to an embodiment of the invention.

FIG. 2 is a flow-chart illustrating the method 200 carried out by the hardware complier 106. The method 200 includes parsing the source code 210, performing an optimization process 220, synthesis 230, and generating hardware realization 240. The source code 102 is input into the hardware complier 106 and a set of configuration instructions e.g., configuration bits (for an FPGA target), or netlist (for a custom circuit target) are output from the compiler 106. However, one of ordinary skill in the art can appreciate that the hardware complier 106 can be designed to accept various types of sequential source program instructions, such as, interactive online commands, markup tags, or some other defined interface.

In step 210, the input source code 102 is parsed and translated into an internal representation according to a known method. The source code 102 typically describes an application or algorithm to be implemented in hardware. The parsing step 210 may analyze the source code in order to generate a directed hyper-graph internal representation (IR) that is pure data flow. Typically, this process is performed by reversing the source code into an IR that represents computations. This is done by using a combination of known techniques in the art, such as static single assignment form (SSA), predication, loop unrolling and array representation. The complier 106 also performs a dependence analysis of the computation to determine the time and order of execution. This is performed in a manner that is known in the art. This may be accomplished by using a combination of static single assignment form, predication, loop unrolling and other well-known complier translation techniques.

The IR is optimized in steps 220, 225 and 235. The optimization process encompasses high-level, mid-level and low-level optimization schemes. The optimization processes generates a plurality of configuration instruction sets.

The high-level optimization 220 is performed by repeatedly traversing the internal representation and using patterns to detect and apply transformations that reduce the size of the IR. The transformations used by the high-level optimization process are, for example, dead code elimination, constant folding, common sub-expression elimination, logical/arithmetic identity reductions, constant propagation and strength reductions. These transformations reduce the code to predicate expressions that represent the function units. These optimizations are target-independent, which indicates that the knowledge of the target (FPGA or custom circuit) is not needed to implement the optimizations.

Mid-level optimizations 225 allow the complier to performs speed and time tradeoffs for implementing the application operations in hardware. The mid-level optimization process generates a plurality of configuration instruction sets. A configuration instruction set is based on a user defined criteria. For example, circuit size, desired speed, and circuit power can be defined as a user defined criteria. The implementation of the hardware can be the hardware that embodies the fastest speed, smallest size, or uses least amount of size. One of the plurality of configuration instruction sets is selected based on the user defined criteria. The mid-level optimization process will be explained in greater detail with regards to FIGS. 3 and 4.

Before the low-level optimizations can be performed, synthesis step 230 is predetermined to translate the architectural and functional descriptions of the design, represented typically by a dataflow graph, to a lower level of representation of the design, such as logic-level and gate level descriptions. Typically, the lowest level of representation is the selected configuration instruction set that is then used by the placement and routing software to physically configure the hardware with the specified components, as shown in step 240.

In step 235, Low-level optimizations are performed on the selected configuration set. Low-level optimizations are, typically, optimizations which must be custom crafted for each target platform. These optimizations are target-dependent. These optimizations can be crafted for the individual target. These optimizations can be, for example, lookup table (LUT)/register merging, register/LUT merging and LUT combining.

In step 240, the hardware realization is generated using the selected configuration instruction set. The hardware realization may be an FPGA or customized hardware device.

Figure 3:
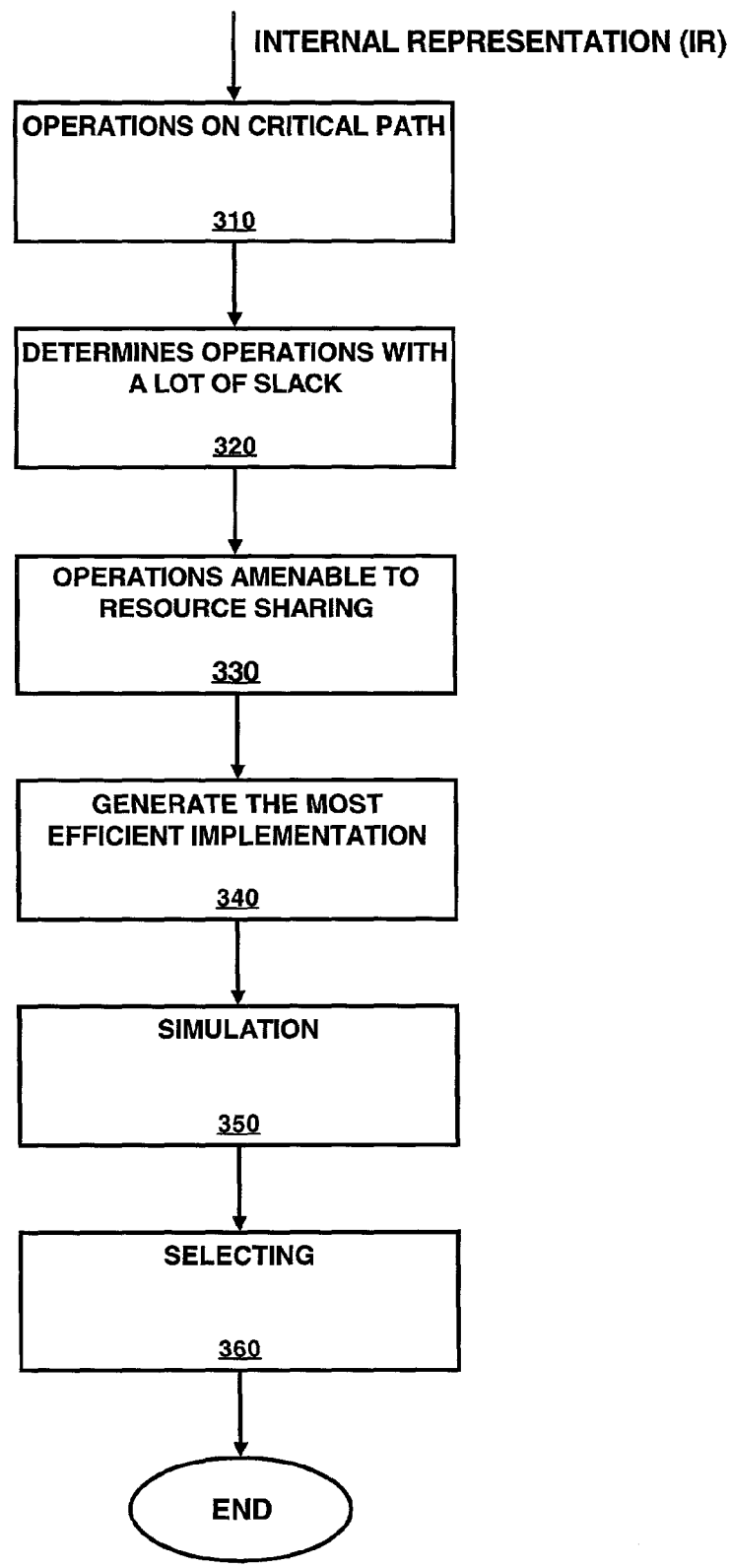
FIG. 3 is a flow-chart illustrating a method of performing mid-level optimizations, according to an embodiment of the invention.

FIG. 3 is a flowchart illustrating the process 300 of making mid-level optimizations in the hardware complier 106, according to an embodiment of the invention. Mid-level optimizations allow the complier 106 to make speed/area tradeoffs in the implemented circuit. A plurality of optimizations are automatically performed until the user-defined criteria are satisfied. The user has specified these criteria before the process begins. One of ordinary skill can appreciate that FIG. 3 is a representation of one such iteration.

The choices made in the mid-level optimization process 300 are target-dependent, such that the optimizations can be directed by a set of parameters determined by the target architecture. The mid-level optimization process 300 comprises the steps of analyzing the internal representation (IR) to determine computations on the critical path as shown in step 310, determine computations with a lot of slack as shown in step 320, determine computations amenable to resource sharing as shown in step 330, generating the most efficient design implementation as shown in step 340, and determining whether the predefined criteria has been met in step 350.

In step 310, the mid-level optimization process 300, determines which computations are on the critical path. The critical path can be a plurality of computations being carried out in parallel. Typically, the process 300 will analyze the IR to look for software loops and other types of repetitive code structures. For example, a loop may have one computation of C=A*B followed by and another computation A=C+D. Both the multiplication and addition operations are on the critical path, because the each iteration of the repetitive computation cannot complete until both operations of the previous are complete. However, there may be other computations in parallel.

The dependence between operations are then analyzed to determine the amount of "slack" of each operation in the IR, as shown in step 320. Slack is defined as the difference between the time available to complete an operation (without slowing down the speed of the overall circuit) and the time that a particular implementation of that operation requires to execute. For example, if the implementation is a multiplication circuit, then the slack is defined as the difference between the minimum time for the system to complete a multiplication operation and a particular implementation of the a multiplier circuit.

If the IR has a large amount of slack, then a slower, smaller implementation of that operation could used, reducing the area of the generated circuit, without slowing down the overall speed of the generated circuit. If the IR has a negative or zero amount of slack, then a faster (and probably larger) implementation might provide faster overall execution. The identified slack values for operations are later used to make optimization decisions in the implementation of the element.

In step 330, the optimization process 300 identifies those computations which are amenable to resource sharing. The optimization process 300 identifies operations that require more computational resources than are available in the target platform. These computations can be transformed so that the expensive resources are time-shared by several independent operations. However, this process tends to slow down the speed of the computation but it is offset by the corresponding reduction in area.

In step 340, a plurality of configuration instruction sets are generated. The user has at least one predefined criteria, which are used to select the a configuration instruction set.

The mid-level optimizations allow the complier to make tradeoffs in the implemented circuit. Micro-pipelining, digit-serial arithmetic and micro-sequencing can be employed in any one of the multiple optimized hardware realizations. In programs containing no feedback, it is possible to insert additional register stages in the synthesized circuit that can increase the clock rate as well as the latency and therefore micro-pipelining can increase the throughput. If an operation is not pipelineable, it is possible that a digit-serial implementation of the operation could lead to area-efficient implementation. The latency would be large, but the overall throughput could be quite high. Computations that require more computational resources than are available in the target platform can sometimes be transformed so that the expensive resources are time-shared by several independent computations. Micro-sequencing may slow down the overall computations, but benefits from the reduction in area.

In step 340, the output of steps 310–330, may include a plurality of configuration instruction sets, wherein each instruction set is operable to generate a different optimized hardware realization. These steps 310–330 may use the user-defined criteria to generate different configuration instruction sets.

In step 350, the configuration instructions are simulated. For example, a configuration instruction set is transmitted to a simulator. The simulator generates a simulation of the hardware realization based on the configuration instruction set. This may be performed for all of the generated configuration instruction sets.

The simulator is used to test the hardware, based on the predetermined criteria, as shown in step 350. The simulator may test the hardware realization for speed, circuit power, and time to execute a predetermined operation. The simulator may also examine the size of the hardware realization. Typically, this operation is performed outside the complier.

In step 360, a configuration instruction set is selected. The compiler receives the results from the simulation and automatically selects the configuration instruction set that closely matches the user's criteria.

FIGS. 4A, 4B, 4C and 4D illustrate block diagrams of multiple circuits, in accordance with the invention. The FIGS. (4A–4D) illustrate three different ways that the following code, int a, b, c;
while (1)

$c=a*b;$ can be implemented using the mid-level optimization process 300. One of ordinary skill can readily appreciate that the above code and followings illustrations are for illustrative purposes only and not meant to limit the scope of the invention in any way. The above code illustrates a multiplication operation. FIGS. 4(A–D) illustrates an example of the different types of multipliers that can be implemented based on the user's predefined criteria.

As stated above, with regards to FIG. 3, the mid-level optimization process 300 determines speed and area tradeoff in the implemented circuit. The process 300 generates a plurality of configuration instruction sets representing a plurality of hardware realizations (design spaces). These plurality of configuration instructions sets are simulated and tested and compared with the user defined criteria. A configuration instruction set is selected based on the output of this comparison. As stated above, the goal could be, for example, size of the circuit, speed, total area of the circuit, and circuit power. The implementation which exemplifies the user's criteria is then selected and the associated configuration instruction set is transmitted to the FPGA or custom circuit 104.

FIGS. 4(A–D) illustrates a plurality of hardware realizations that can be implemented from the above software. Each of the plurality of realizations has specific area, speed and power characteristics.

Figure 4A:
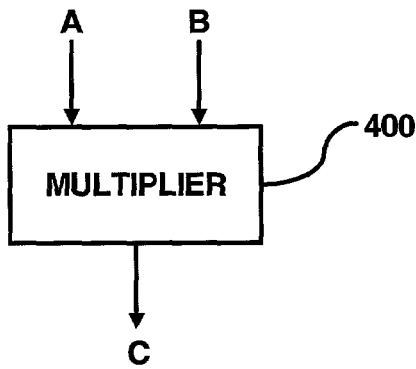
FIG. 4A is an illustration of an unpipelined multiplier, according to an embodiment of the invention.

FIG. 4A illustrates an unpipelined multiplier circuit 400 which can be implemented by optimization process. The unpipelined multiplier circuit 400 operates by receiving inputs via operands, a and b every clock cycle (II=1) and produces one result (c) at the end of the clock cycle. The unpipelined multiplier 400 generally consumes a great deal of area and is slow because of the large number of logic levels required in its implementation.

Figure 4B:
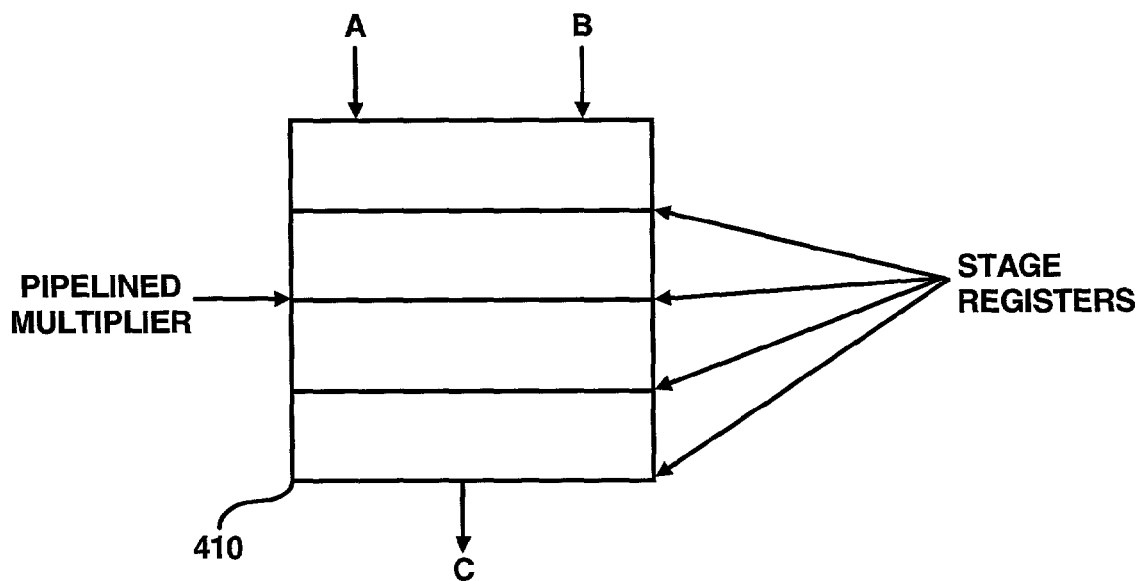
FIG. 4B is an illustration of a micropipelined multiplier, according to an embodiment of the invention.
Figure 4C:
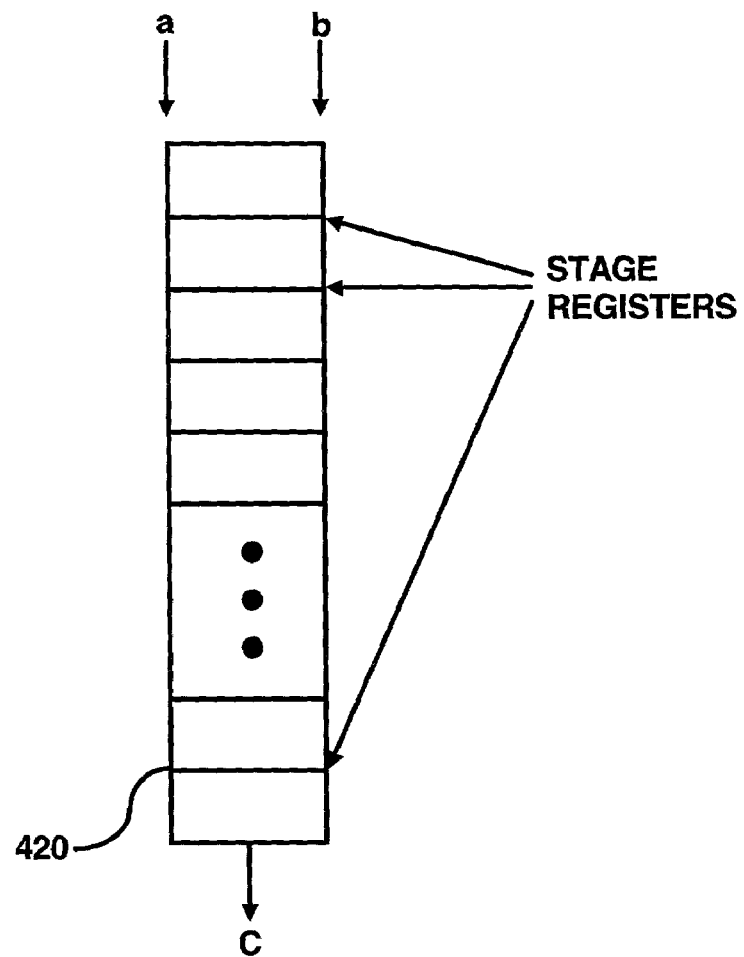
FIG. 4C is an illustration of an serial multiplier, according to an embodiment of the invention.

FIG. 4B illustrates a pipelined multiplier 410 which can be implemented by from the above code. The pipelined multiplier 410 is slightly larger than the unpipelined multiplier 400, but has a higher clock speed because of the staging registers, as well as increased latency. FIG. 4C illustrates a digit-serial version (such as a semi-systolic, bit serial multiplier) of the multiplier 420 represented by the above code. The digit-serial multiplier 420 requires a small amount of area, but can input new operands a and b every N cycles, which increases the latency.

Figure 4D:
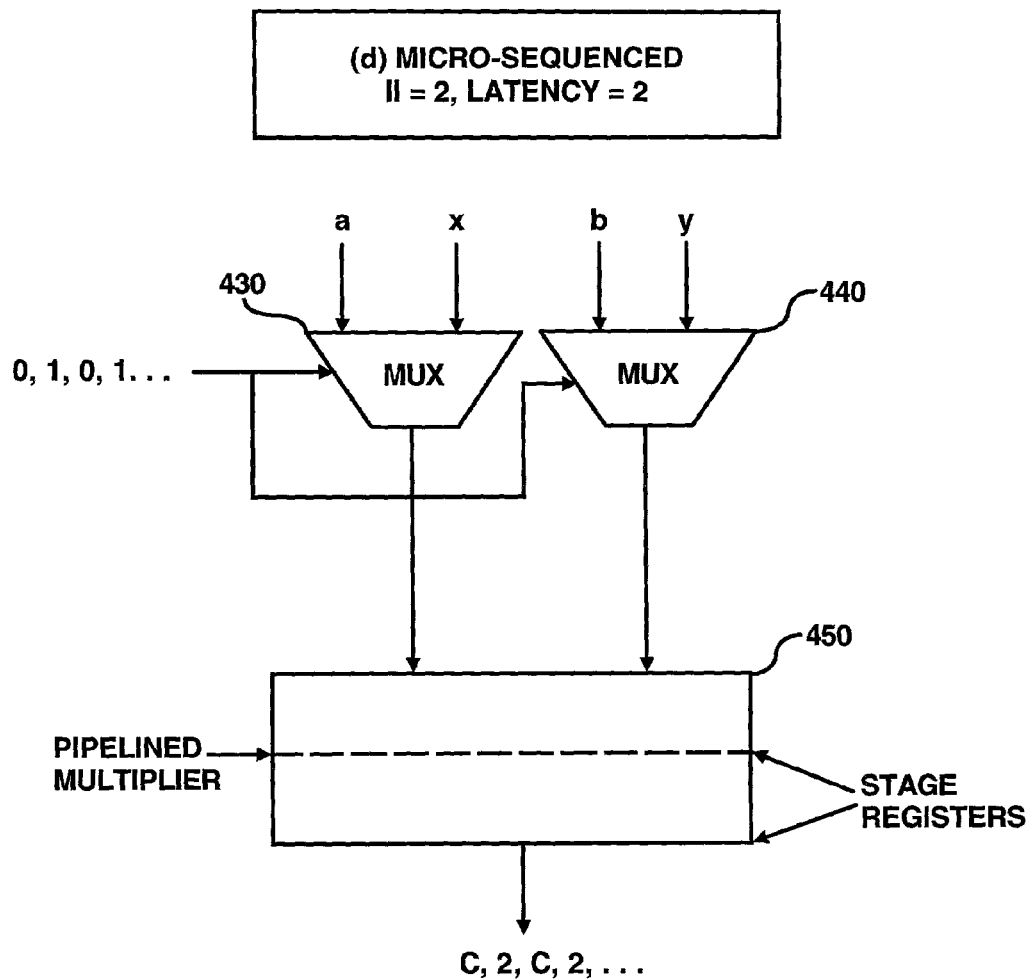
FIG. 4D is an illustration of a micro-sequenced multiplier, according to an embodiment of the invention.

FIG. 4D illustrates a micro-sequenced multiplier 440 implementing a time-sharing capability between function units. The multiplier 440 illustrates how an expensive function unit can be time shared between two independent computations by multiplexing the inputs.

The above multiplier implementations reflect an example of the tradeoffs in the optimization implementation. One of ordinary skill can appreciate that the best implementation or the implementation selected by the user will depend on a plurality of factors such as the nature of the program, the implementation or problem to be solved.

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

What is claimed is:

1. A method of compiling, the method comprising the steps of:
   parsing a source code;
   performing a plurality of optimizations on the parsed code;
   generating a plurality of configuration instruction sets based on the optimized source code; and
   automatically selecting one of the plurality of generated configuration instruction sets by comparing characteristics of the configuration instruction sets to a user-defined criteria, the selected configuration instruction set being used to configure hardware.

2. The method according to claim 1, wherein the step of parsing further comprises the step of:
   parsing the source code into portions, wherein the portions include computations.

3. The method of claim 1, wherein the step of automatically selecting further comprises the steps of:
   determining characteristics for the each of the plurality of the configurable instruction sets; and
   selecting one of the plurality of configuration instructions sets based on determined the characteristics of that set, wherein the characteristics are compared to the user-defined criteria.

4. The method according to claim 3, wherein the step of determining characteristics comprises receiving simulation results associated with each configuration instruction set.

5. The method according to claim 1, wherein the step of performing optimizations further comprises the steps of:
   determining whether operations parsed from the source code are on a critical path;
   determining whether operations parsed from the source code have a predetermined amount of slack; and
   determining whether operations parsed from the source code are operable to share resources.

6. The method according to claim 5, wherein the critical path is a plurality of operations being performed simultaneously.

7. The method according to claim 1, wherein the user defined criteria is the speed to complete a computation, size of circuit, and circuit power.

8. The method according to claim 1, further comprising the step of:
   generating an internal representation of the source code.

9. The method according to claim 1, further comprising the step of:
    configuring hardware using the selected configuration instruction set.

10. The method according to claim 9, wherein the hardware includes one of:
    an FPGA or a custom integrated circuit.

11. A method for compiling source code comprising steps of:
    generating an internal representation of the source code;
    analyzing data flow properties of the internal representation in order to optimize the internal representation;
    automatically generating a plurality of configuration instruction sets based on the optimized internal representation;
    generating a plurality of configuration instruction sets based on the optimized source code; and
    automatically selecting one of the plurality of generated configuration instruction sets by comparing characteristics of the configuration instruction sets to a user defined criteria, the selected configuration instruction set being used to configure hardware.

12. The method according to claim 11, wherein analyzing the data flow properties further comprises the steps of:
    determining whether operations parsed from the source code are on a critical path;
    determining whether operations parsed from the source code have a predetermined amount of slack; and
    determining whether operations parsed from the source code are operable to share resources.

13. The method according to claim 12, wherein the critical path is a plurality of computations being performed simultaneously.

14. The method according to claim 11, wherein the step of automatically selecting further comprises the steps of:
    determining characteristics for the each of the plurality of the configurable instruction sets; and
    selecting one of the plurality of configuration instructions sets based on determined the characteristics of that set, wherein the characteristics are compared to the user-defined criteria.

15. The method according to claim 14, wherein the user defined criteria is the speed to complete a computation, size of circuit, and circuit power.

16. The method according to claim 11, further comprising the step of:
    configuring hardware using the selected configuration instruction set.

17. A system for using software to generate a circuit comprising:
    a processor operable to receive source code;
    a complier automatically generating a plurality of configuration sets from the received source code and selecting one of the plurality of configuration sets by comparing characteristics of the configuration instruction sets to user defined criteria;
    and a configurable hardware device receiving the selected configuration instruction set and being configured based on the received configuration instruction set.

18. The system of claim 17, wherein the configurable hardware device is a FPGA or custom circuit.

19. The system according to 17, wherein the compiler parses the source code into an internal representation.

20. The system according to claim 17, wherein the compiler analyzes an internal representation of the source code to generate the plurality of configuration instruction sets.

21. The system according to claim 20, wherein the data flow system determines whether operations parsed from the source code are on a critical path; determines whether operations parsed from the source code have a predetermined amount of slack; and determines whether operations parsed from the source code are operable to share resources.

22. The system of claim 17, wherein the system further comprises:
    a memory device connected to the processor and stores the plurality of configuration instruction sets.

23. An apparatus for compiling, the apparatus comprising:
    means for parsing a source code;
    means for performing a plurality of optimizations on the parsed code;
    means for generating a plurality of configuration instruction sets based on the optimized source code; and
    means for automatically selecting one of the plurality of generated configuration instruction sets by comparing characteristics of the configuration instruction sets to a user-defined criteria, the selected configuration instruction set being used to configure hardware.

24. The apparatus according to claim 23, wherein the means for parsing further comprises:
    means for parsing the source code into portions, wherein the portions include computations.

25. The apparatus of claim 23, wherein the means for automatically selecting further comprises:
    means for determining characteristics for the each of the plurality of the configurable instruction sets; and
    means for selecting one of the plurality of configuration instructions sets based on determined the characteristics of that set, wherein the characteristics are compared to the user-defined criteria.

26. The method according to claim 25, wherein the means for determining characteristics comprises receiving simulation results associated with each configuration instruction set.

* * * * *